United States Patent [19]

Kreider

[11] Patent Number: 4,772,370

[45] Date of Patent: Sep. 20, 1988

[54] PROCESS FOR PRODUCING ICOSAHEDRAL MATERIALS

[75] Inventor: Kenneth G. Kreider, Potomac, Md.

[73] Assignee: The United States of America as represented by the Secretary of Commerce, Washington, D.C.

[21] Appl. No.: 65,530

[22] Filed: Jun. 23, 1987

[51] Int. Cl.$^4$ .................................... C23C 14/40
[52] U.S. Cl. .................... 204/192.15; 204/192.12
[58] Field of Search .......... 204/192.1, 192.11, 192.12, 204/192.15

[56] References Cited

U.S. PATENT DOCUMENTS 4,173,606 11/1979 Stoy et al. ............................. 264/1
4,511,614 4/1985 Greeson et al. ..................... 428/141
4,533,441 8/1985 Gamblin ................................. 204/3
4,621,031 11/1986 Scruggs ............................... 428/627

OTHER PUBLICATIONS

Brian Chapman, Glow Discharge Processes, John Wiley & Sons, New York, 1980, pp. 201-203.

Primary Examiner—John F. Niebling
Assistant Examiner—William Leader
Attorney, Agent, or Firm—Thomas Zack; Alvin Englert; Albert Tockman

[57] ABSTRACT

A method for producing quasi-crystalline films by direct vapor deposition through sputtering is provided. The method is applicable to all alloys which can be converted to quasi-crystalline structure by melt spinning.

14 Claims, 7 Drawing Sheets

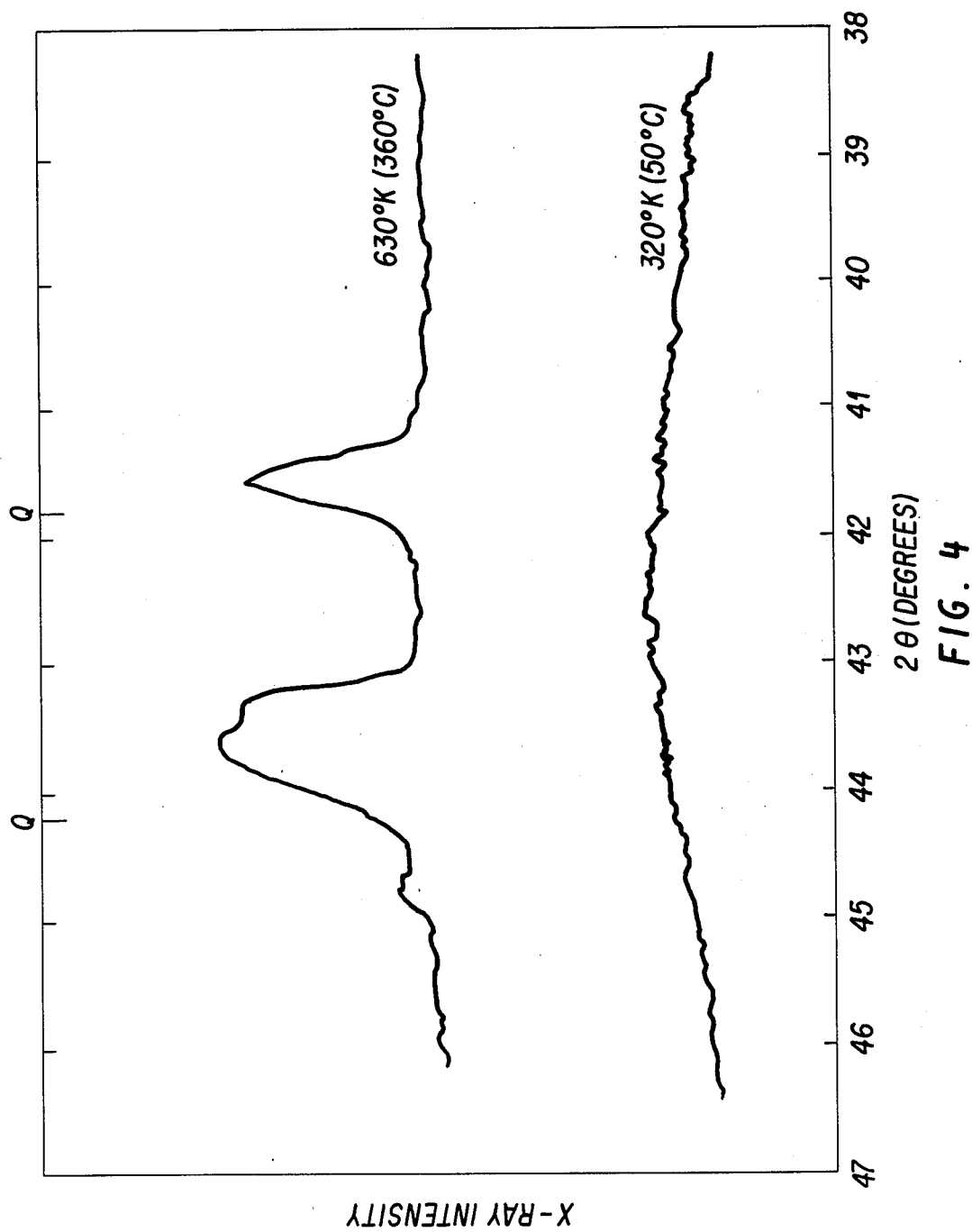

PROCESS FOR PRODUCING ICOSAHEDRAL MATERIALS

BACKGROUND OF THE INVENTION

1. Field of the Invention

The present invention pertains to formation of quasi-crystalline films by direct vapor deposition. The present invention overcomes difficulties of prior art techniques such as casting a quasi-crystalline alloy against a spinning wheel (melt spinning) and solid state transformation. More particularly, the present invention is a sputtering method which produces quasi-crystalline materials. It involves a direct vapor to solid transformation which achieves a much higher individual atomic quench rate than solidification from the melt as in melt spinning.

2. Quasi-crystals

Quasi-crystals are neither crystalline nor amorphous. They do not have long range crystalline order or belong to the classic fourteen point groups of crystalline materials. The quasi-crystalline materials have five-fold symmetry and near-crystalline order which is in contrast to the amorphous or glassy solids. The research over the last twenty years on rapidly quenched glassy metals (intermetallic glasses) has led to significant applications as corrosion-resistant and magnetic materials. The quasi-crystals were discovered less than two years ago. The advantages of these materials are analogous to the amorphous intermetallic glasses because they have effectively very fine grain size with excellent uniformity and therefore unique and superior potential as corrosion resistant alloys and as magnetic materials. The quasi-crystalline materials have advantages over the amorphous intermetallic glasses and alloys. They have higher stability at elevated temperatures and for longer time periods than amorphous material of the same composition. This higher uniformity than the crystalline makes quasi-crystalline films useful for laser discs, optical films, and corrosion or wear resistant films.

Quasi-crystals are discussed in a number of journal articles including the following which are incorporated herein by reference:

D. Schectman, I. Bleck, D. Gratias, and J. W. Cahn, Phys. Rev. Lett., Volume 53, No. 20, page 1951 (1984); P. J. Steinhardt, Quasi-Crystals, American Scientist, Volume 74, page 586 (1986); D. R. Nelson, Quasi-Crystals, Scientific American, Volume 255, No. 2, page 42 (1986).

To understand the underlying structure of quasicrystals, it is first necessary to have some understanding of the structure of a conventional crystal. Perhaps the most basic principal of solid state physics is that a solid is composed of atoms packed in a dense arrangement and that the ordering of the atomic arrangement determines many properties of the solid. The atomic arrangement in a solid can be compared to a mosaic. Atoms or clusters of atoms appear in repeating motifs called unit cells, which are analogous to tiles in a mosaic. The order in an arrangement of atoms (or in a mosaic) is determined by the way in which the unit cells (or tiles) are joined to form the complete structure.

Crystals have highly ordered atomic arrangements in which all the unit cells are identical, analogous to a mosaic constructed from a single tile shape, as in typical bathroom tiling. A single atomic cluster or unit-cell shape is repeated periodically (with equal spacing between cells) to form the structure. Crystals have positional order: given the position of one unit cell, the positions of all the other unit cells are determined. Crystals also have orientation order: given the orientation of one unit cell, the orientations of all the other unit cells are determined.

The orientation order can be characterized in terms of a rotational symmetry. A special set of discrete rotations leaves the orientations of the unit cells unchanged. According to the well-established, rigorous theorms of crystallography, only a small list of rotational symmetries is possible for crystals: crystals can have two-fold, three-fold, four-fold, or six-fold axes of rotational symmetry; other possibilities, such as five-fold, seven-fold, or eleven-fold symmetry are not allowed. This corresponds to the observation that one can tile a bathroom wall using a single tile shape if the tiles are all rectangles, triangles, squares, or hexagons, but not if they are pentagons. A "crystal" tiling can also be constructed if the tile shape is a parallelogram, in which case the analogous crystalline lattice exhibits no rotational symmetry.

In contrast to crystals, glass has a highly disordered atomic arrangement. A glass is typically formed by rapidly cooling a vapor or liquid well below its freezing point until the atoms are frozen into a dense but random arrangement. Window glass, the most common example, is formed by silicon and oxygen joined in a random network of covalent (directed) bonds. Physicists have succeeded in rapidly cooling various mixtures of metal atoms to form "metallic" glasses. In this case, there are no preferred directions for the bonds, and the atoms are packed in a dense but random arrangement.

A glass is analogous to a mosaic form from an indefinite number of tile shapes randomly joined together. The concept of a unit cell is normally not used in this case, since there is no well-defined scheme for dividing the atoms into infinitely many unit-cell shapes. The structure has neither positional nor orientational order: the position and orientation of one unit cell does not determine the position, orientation or shape of others a distance away.

The possibility of a new class of ordered atomic structures has been proposed by Levine, D. and P. J. Steinhardt, Quasi-Crystals: A New Class Of Ordered Solids, Phys. Rev. Lett. 53:2477, based on a detailed study of a special two-dimensional tiling pattern discovered by Penrose, R., Bull. Inst. Math. and Appl., 10:266 (1974), some ten years earlier. The new structures are analogous to mosaics with more than one tile shape but only a finite number of shapes. Although the structures have positional order, the tiles are neither periodically nor randomly spaced; instead they are quasi-periodically spaced. This means that, given the position of one tile, the positions of the other tiles are determined according to a predictable but subtle sequence which never quite repeats. The new structures also exhibit orientational order; each tile of a given shape is oriented along one of a small, discrete set of special directions. The rotational symmetry is defined by the set of rotations which leaves the set of orientations for each of indifferent tile shapes unchanged. Because the new structures are highly ordered like crystals, but are quasi-periodic instead of periodic, they have been called quasi-periodic crystals or quasi-crystals for short.

Just as the theoretical notions were being developed, Schectman, Blech, Gratias and Cahn, Metallic Phase With Long-Ranged Orientational Order And No Translational Symmetry, Phys. Rev. Lett., Vol. 53, No. 20, page 1951 (1984), were independently studying a puzzling new alloy of aluminum and manganese which, they discovered, had five-fold symmetry axes. The new material was discovered accidentally as part of an extensive survey to develop lighter and stronger aluminum alloys. It was formed by a method known as melt spinning, in which a hot liquid alloy mixture is sprayed onto a cold-spinning wheel so that the liquid rapidly solidifies. The alloys being studied by Schectman and his colleagues cooled into long strips of metal. For an appropriate mixture of aluminum and manganese, the strips contain tiny "grains," about 10 microns across, within which appeared to be a homogeneous material.

To determine the atomic structure of the new material, Schectman and his colleagues used a technique called electron diffraction analysis. They aimed a beam of electrons at a single grain of an alloy and recorded the pattern formed when the electrons scattered off the atoms in the material and struck a photographic plate. For a crystal, it is well known that the electrons scatter coherently from the positionally ordered array of atoms to form a "diffraction pattern" of sharp spots on the plate. The pattern of spots depends on the symmetry of the crystal and its orientation with respect to the electron beam. For a glass, the electrons scatter off an isotropic, disordered array of atoms to form a diffraction pattern of diffuse rings which is the same for all orientations.

For the aluminum-manganese alloy, a pattern of sharp spots was found which clearly indicated a five-fold symmetry axis. By rotating the sample in the electron beam, it was found that the material had many five-fold symmetry axes, as well as three-fold and two-fold symmetry axes. By noting the angle between the symmetry axes, it could be shown that the material had a three-dimension icosahedral symmetry, one of the most familiar examples of a disallowed crystallographic symmetry. The icosahedron is one of the five regular polyhedra that are referred to as Platonic solids. The word icosahedron means "twenty faces"; the icosahedron has twenty identical triangular faces, thirty edges, and twelve vertices. The black pentagons on the surface of a soccer ball are centered on the vertices of an icosahedron. Each of the vertices lies on one of six five-fold symmetry axes which connect opposite vertices. Because of the five-fold symmetry axes, icosahedral symmetry is disallowed for crystals. In particular, icosahedra cannot be packed so as to fill space completely, just as pentagons cannot be joined to form a complete tiling of a plane.

Although the diffraction patterns found for the new alloys are clearly impossible for crystals, they correspond very closely with the theoretical computations of the diffraction pattern expected for icosahedral quasi-crystal. Levine and Steinhardt, Quasi-Crystals: A New Class Of Ordered Solids, Phys. Rev. Lett. 53:2477 (1984); Elser, Indexing Problems In QuasiCrystal Diffraction, Phys. Rev. B., 32:4892 (1985); Kalugin, et al, Six-Dimensional Properties Of $Al_{0.86}Mn_{0.14}$ Alloy, JETP, 41:119; J. Phys. Lett. 45:L601 (1985); Duneau and Katz, Quasi-Periodic Patterns, Phys. Rev. Lett. 54:2688 (1985), all incorporated by reference. The correspondence led to the suggestion that the new alloy may be the first example of a quasi-crystal.

The unique symmetry properties of quasi-crystals account for the distinctive diffraction pattern, the pattern produced by scattering electrons off an ideal quasi-crystalline solid. For a traditional crystallographer, one striking feature is that the pattern consists of sharp spots, just as for a periodic crystal, but with a symmetry that is disallowed for crystals. The sharp spots are the sign of positional order. The traditional crystallographer has alway associated positional order with periodicity, and therefore would expect only the usual symmetries allowed for a periodic crystal. Instead, we now see that another kind of positional order—quasi-periodic order—allows the possibility of diffraction patterns with new symmetries.

Another striking feature is that the pattern of diffraction spots is dense; in particular between any two spots there are yet more spots. In the diffraction patterns for a periodic cubic crystal, by contrast, there is an equal interval between spots along each symmetry direction, due to the fact that all the unit cells are equally separated in the atomic structure. In a quasi-crystal, however, the unit cells are separated by at least two different spacing lengths whose ratio is an irrational number. It is straightforward to show that the diffraction spots should lie at all possible integer combinations of at least two intervals whose ratio is likewise irrational. Allowing for positive and negative integer combinations a dense set of spots should appear.

Thus, when Schechtman and his colleagues reported the very unusual diffraction pattern of an aluminum-manganese alloy which consisted of a relatively dense pattern of sharp spots with an icosahedral symmetry in 1984, it was a clear signal to the theorist that the alloy might be an example of the hypothetical phase they were studying—an icosahedral quasi-crystal.

DISCUSSION OF THE PRIOR ART

Until recently, all quasi-crystals have been produced by melt spinning or solid state transformations, with the former technique being by far the predominant method. Melt spinning includes casting the molten alloy against a spinning wheel to effect quench rates from the liquid of greater than $10^{6°}$ C. per second. The formation of the quasi-crystalline icosahedral Al-Mn phase (i-phase) by rapid solidification (melt spinning) was established initially by Shechtman et al, Phys. Rev. Lett., 53, No. 20, page 1951 (1984). Subsequently, Schaefer, Scripta Metallurgica, 20, 11, 87 (1986), incorporated herein by reference, using electron beam surface melting, identified the solidification conditions necessary to form the i-phase, nothing that for imposed growth velocities of approximately 1 centimeter per second the iphase nucleates and grows dendritically in competition with another quasi-crystalline phase, the decagonal phase. A second approach for forming icosahedral Al-Mn was reported by Lilenfeld et al, Phys. Rev. Lett., 55, 15, page 1587 (1985), and by Knapp and Follstaedt, Phys. Rev. Lett., 55, 15, 1591 (1985) and Phys. Rev. Lett., 56, No. 17, page 1827 (1986), all incorporated herein by reference. Both of these groups form the icosahedral phase from laminated multi-layer Al and Mn evaporated films using ionbeam irradiation and thermal annealing to effect the crystallineto-amorphous-to-quasi-crystalline transformations in the solid state.

The most immediate experimental challenge is to find a material and a technique to make larger and more perfect samples. The original aluminum-manganese alloy was formed by the very rapid cooling technique of melt spinning. It is essentially impossible to keep the cooling rate and relative concentration of aluminum and manganese constant over the length and thickness of the strip. In general, lack of control in the cooling process and the simultaneous growth of many grains produces strain and defects even in crystals and a variation in the size of the grains produced.

Since the original discovery, melt spinning and several other rapid-cooling techniques have been used to produce some twenty or thirty different metallic alloys which exhibit an icosahedral phase. However, all have been produced with rather small and imperfect grains. This poses a difficult problem for crystallographers. Although there have been some interesting speculations about the atomic structures of the new materials, Elser and Henley, Crystal and Quasi-Crystal Structure In Al-Mn-Si Alloys, Phys. Rev. Lett., 55:2883 (1985); and Guyot and Audier, A Quasicrystal Model For Al-Mn, Phil. Mag., B52:L15 (1985); all incorporated herein by reference, some of the mathematical aspects of quasi-crystalline structures make it much more difficult to determine the atomic arrangement compared with that of a periodic crystal, Bak, Phenomonological Theory Of Icosahedral Incommensurate Order In Al-Mn Alloys, Phys. Rev. Lett., 54:1517 (1985); Bak, Symmetry, Stability and Elastic Properties of Icosahedral Incommensurate Crystals, Phys. Rev. B., 32:5764 (1985); and Bak, Icosahedral Crystals: Where Are The Atoms?, Phys. Rev. Lett., 56:861 (1986); Socolar et al, Quasicrystals II: Unit Cell Configurations, Phys. Rev. B., 34:617 (1986), all incorporated herein by reference. Only with larger and more perfect grains can a full battery of experimental techniques be applied that will reveal the detailed atomic configuration and be practical for commercial products.

The problem with cooling liquid alloys more slowly to obtain larger and more perfect grains has been that the material then forms crystals instead of quasicrystals; that is, the lowest energy phase for these materials is the crystalline phase, and only by cooling the liquid rapidly can it be trapped in the icosahedral phase. For different materials, the icosahedral phase has different energies with respect to the crystalline phase, and it is at least theoretically possible that for some material the icosahedral phase has lower energy than the crystalline phase. However, there is no reliable theory for predicting which particular elements or relative mixtures would form the most stable samples of the icosahedral phase. If a quasi-crystalline material with an energy close to or lower than the energy of the crystalline phase can be found, a much slower cooling method can be applied and, one hopes, a larger and more perfect sample formed. Recently, icosahedral grains up to a tenth of a millimeter in size have been reported in a slowly cooled alloy of aluminum, lithium, and copper, Ryba et al, unpublished, Department of Metallurgy, Pennsylvania State University (reported by Steinhardt, P. J., Quasicrystals, Amer. Scientist, Vol. 74, page 586, 1986); however, extensive measurements of the physical properties have not been completed.

It is known to employ sputtering for a vapor deposition, as disclosed by U.S. Pat. No. 4,533,603 to Fukuda et al, incorporated herein by reference. The sputtering process is a direct vapor to solid transformation which has a much higher individual atomic quench rate than solidification from a melt.

SUMMARY OF THE INVENTION

It is an object of the present invention to provide an improved method, using vacuum sputtering, to produce quasi-crystalline structures of metastable alloys.

What is unique about the present invention is that the quasi-crystal formation is from the vapor state depositing directly as the quasi-crystalline solid. Advantages of this approach include the flexibility of producing large area films, enhanced control of fabrication conditions such as composition and temperature, and production from constituents that would not form a suitable melt for melt spinning. Most particularly, alloys comprising aluminum and a transition metal, wherein the alloy can be melt spun to produce a quasi-crystal structure. As used herein, a transition metal includes elements 21 through 29 (scandium through copper) of the periodic table, 39 through 47 (yttrium through silver), 57 through 79 (lanthanum through gold) and all known elements from 89 (actinium) and above.

The present invention will produce quasi-crystalline structures from any alloys from which quasi-crystalline structures may be produced by melt spinning. Particularly, the present invention is applicable to alloys comprising aluminum which can be converted into quasi-crystalline structures by melt spinning. The present inventor has discovered critical parameters and their ranges for controlling sputtering to control the structure of thin films. The most critical parameters for controlling the structure of thin films are the temperature of the substrate upon which the alloy is deposited and the rate of deposition. It is also important to control the sputtering atmosphere to minimize contamination. The substrate temperature during deposition controls the mobility of the atoms as they are deposited on the film and therefore limits the structural reformation on the surface. This permits the film to be produced without the formation of the equilibrium intermetallic phases and controls the size of the particles in the film. For Al-Mn alloys and Al-Mn-Si alloys the substrate temperature ranges from about 200° to about 450° C., preferably 350° to about 400° C.

BRIEF DESCRIPTION OF THE DRAWINGS

FIG. 4 shows sputtering an alloy of aluminummanganese (20.2 atomic %)-silicon (4.7 atomic %) onto quartz;

FIG. 7b displays the micro diffraction pattern corresponding to the largest particle shown on FIG. 7a.

DETAILED DESCRIPTION OF THE PREFERRED EMBODIMENTS

Figure 1:
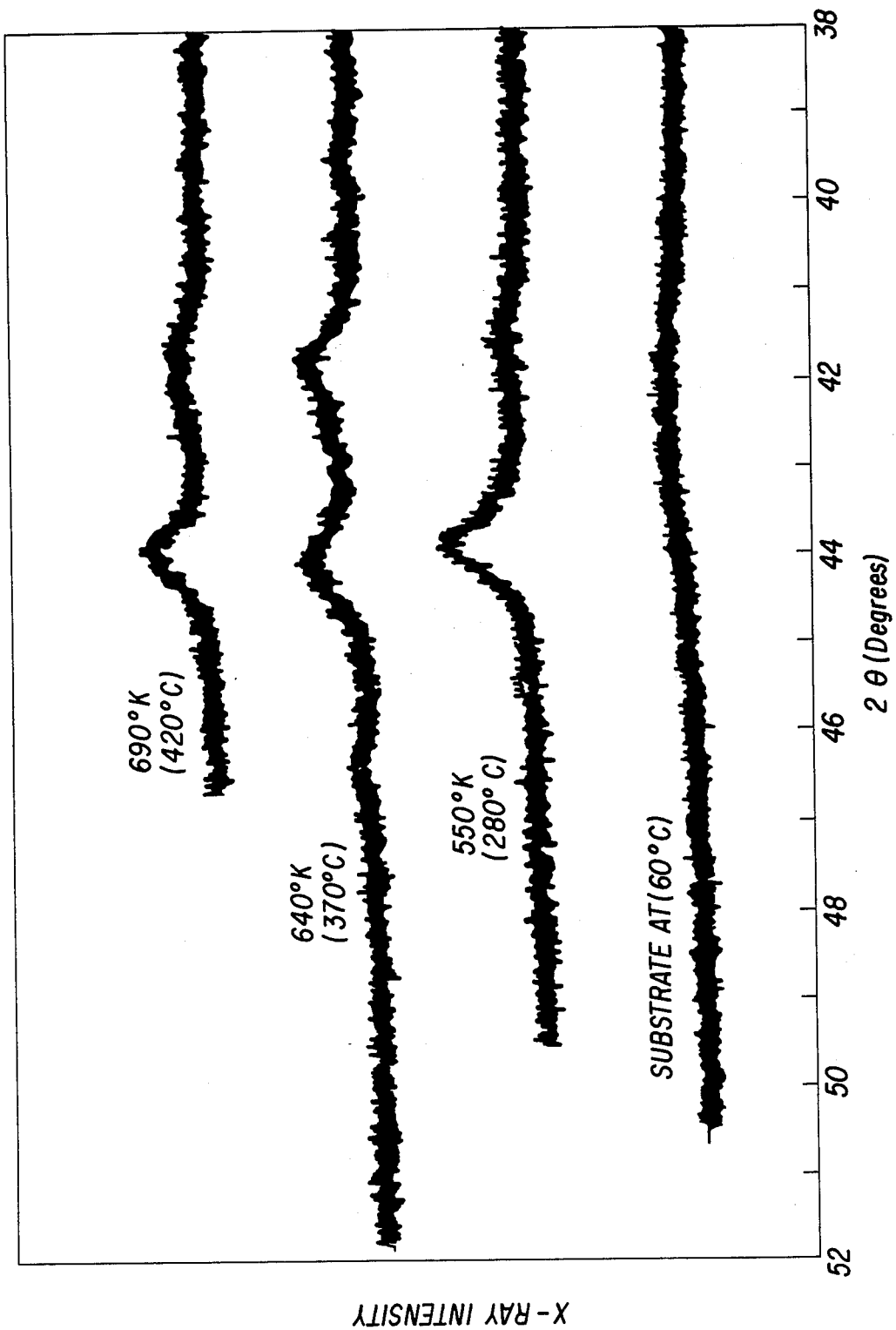
FIG. 1 shows a number of X-ray diffraction patterns for aluminum-manganese sputtered onto glass over a variety of temperatures.

As disclosed in U.S. Pat. No. 4,533,603 to Fukuda et al, in the sputtering method: glow discharge is conducted in a vacuumed inert gas atmosphere, the gas ions are driven to collide with a cathode (i.e., target) to evaporate the cathode material in a form of atoms or groups of atoms and the sputtered metal atoms are deposited onto a substrate disposed close to an anode, thereby forming a thin metal layer on the substrate. A magnetron sputtering device, in which a magnet is disposed behind the cathode (i.e., the target) so that a magnetic field is oriented to be perpendicular to the electric field in a discharge space, is particularly effective to prevent the substrate from rising above desired temperatures. This magnetron sputtering device is designed so that electrons generated by the discharge are turned by the magnetic field and permitted to drift, whereby the electrons are prevented from flowing to the substrate which is disposed to face the cathode and the temperature rise of the substrate is thereby suppressed. Another advantage is that the magnetron-type sputtering device makes high speed sputtering possible.

In the present invention, the gas is an inert gas, such as the noble gases, most preferably argon. The alloys which can be used to produce quasi-crystalline structures by the present invention are those alloys which can be used to produce quasicrystalline structures by melt spinning, preferably the alloys comprise aluminum. Most preferred alloys have the following compositions, $30\pm1$ weight % manganese with the remainder being aluminum, or $34\pm1$ weight % manganese, $4\pm\frac{1}{2}$ weight % silicon with the remainder being aluminum. Any inert substrate may be employed. Preferred substrates are metal oxides, such as alumina ($Al_2O_3$), silicon oxide or ionic crystals.

The system is preferably evacuated prior to sputtering to remove reactive gas molecules from the atmosphere surrounding the anode and cathode. Preferably a pressure of at most 3 pascals is employed. This low pressure prevents collisons of target atoms with gas molecules. Most preferably a pressure of at most 0.3 pascals is employed.

The most critical parameters for controlling the structure of the thin films are the substrate temperature and the rate of deposition. The substrate temperature during deposition controls the mobility of the atoms, as they are deposited on the film, and therefore limit the structural reformation on the surface. This permits the film to be produced without the formation of the equilibrium intermetallic phases and controls the size of the particles in the film. Thus, the substrate temperature must be high enough to prevent forming amorphous material but low enough to prevent forming crystalline material. To produce Al-Mn or Al-Mn-Si alloys having quasi-crystalline structures, the substrate temperature ranges from about 200° to about 450° C., preferably 350° to about 400° C. The rate of deposition ranges from about 0.1 to about 1.0 nanometers per second, preferably about 0.2 to about 0.3 nanometers per second.

To determine the substrate temperature for other alloys, alloys known to produce quasi-crystals by other processes would be made by sputtering at a range of temperatures, typically from about 150° K. to about 700° K. The products of sputtering would then be tested to determine their structure by electron microscopy, x-ray diffraction or other appropriate methods. Then the determined structures would be compared with known crystal-line, amorphous and quasi-crystalline structures until a match to a quasi-crystalline structure is found.

The present invention has advantages over producing quasi-crystals by melt spinning because the present invention forms quasi-crystals by depositing the vapor state directly onto the substrate as a quasi-crystalline solid. The advantages of this approach include the flexibility of producing large area films, enhanced control of fabrication conditions such as composition and temperature, and production from constituents that would not form a suitable melt for melt spinning.

The present invention produces quasi-crystalline material from a wide range of materials. These include all alloys which can be made into quasi-crystalline material by melt spinning especially aluminum-containing alloys. One quasi-crystalline structure is also known as an icosahedral phase (i-phase) Another quasi-crystalline structure is the decagonal phase (T-phase). See Schaefer, Scripta Metallurgica, 20, 11, 87 (1986). The icosahedral phase was first discovered in rapidly solidified aluminum-manganese alloys by Shechtman et al, Phys. Rev. Lett., 53, No. 20, p. 1951 (1984), incorporated herein by reference. Moreover, icosahedral phases have been reported in many other aluminum-transition metal systems as disclosed by Bancel and Heiney, University of Pennsylvania, preprint, incorporated herein by reference. Moreover, icosahedral phases have been reported in several non-aluminum base systems: $Mg_{32}(Al,Zn)_{49}$, $Mg_4CuAl_6$, Cd-Cu, $Pd_3USi$, and $(Ti_{1-x}V_x)_2Ni$ as disclosed by Bendersky and Ridder, Nucleation Behavior Of Al-Mn Icosahedral Phase, J. Mater. Research, 1, 405 (1986), incorporated herein by reference.

A wide variety of quasi-crystals which have this icosahedral phase are also disclosed by Schaefer, The Metallurgy of Quasicrystals, Scripta Metallurgica, 20 11, 87 (1986), incorporated herein by reference. Schaefer discloses icosahedral phases in aluminum-based binary systems such as aluminum-chromium, aluminum-iron, aluminum-manganese, aluminum-ruthenium, and aluminumvanadium; and a five fold electron diffraction pattern (possible "T" phase) in aluminum-palladium, and aluminum-platinum. Schaefer also discloses that ternary icosahedral phases can readily be formed in which, for example, some iron is substituted for manganese. He discloses icosahedral material has been made in alloys such as Al, 16 weight % Mn, 10 weight % Fe, and Al, 22 weight % Mn, 4 weight % Fe.

Based on a hypothesis that the icosahedral phase would be stabilized by substituting for some of the aluminum, a smaller atom that would reduce the effective average size of the aluminum atoms, 6 atomic % silicon was included in an aluminum alloy containing 20 atomic % manganese, and it was found that the melt spun material was almost single-phase icosahedral, with only minute islands of face centered cubic aluminum between the icosahedral grains as disclosed by Schaefer, Scripta Metallurgica, 20, 11,87 (1986). Similarly, Schaefer found that a melt-spun aluminum, 31 weight % manganese, 4 weight % iron alloy was single phase decagonol while an aluminum, 30 weight % manganese, 4 weight % iron, 5 weight % silicon alloy was single phase icosahedral. Schaefer also discloses that precipitates with icosahedral diffraction patterns have been reported in an alloy of aluminum, 2.5 weight % lithium, 1.2 weight % copper, 0.9 weight % manganese, 0.1 weight % zirconium, which was chill cast, solutionized at 530° C. and overaged at 325° C. Schaefer also discloses that Ramachandrarao et al examined rapidly quenched $Mg_{32}(Al,Zn)_{49}$ and found it to be icosahedral.

Schaefer also discloses that icosahedral material has been found in an amorphous matrix or with the stable $Ti_2Ni$ phase in melt spun ribbons of $(Ti_{1-x}V_x)_2$ Ni alloys with x=0.0–0.3 and that icosahedral material has been formed by crystallization of an amorphous Pd, 20 weight % U, 20 weight % silicon alloy. Thus it is likely that icosahedral material will eventually be reported in many more alloy systems.

The present invention is further illustrated by means of the following examples.

Quasi-crystals were prepared by the method of the present invention from an aluminum-manganese alloy composition containing 17.7 atomic % manganese (30 weight % manganese) and from an aluminum, manganese and silicon composition containing 20.2 atomic % (34 weight %) manganese and 4.7 atomic % (4 weight %). Pre-alloyed targets having these compositions were prepared by melting together pure starting elements (99.9 weight % purity) and casting in a copper chilled mold under a $7 \times 10^{-4}$ pascal vacuum. Rather than employing a pre-alloyed target, it would also be possible to produce similar structure by co-depositing films using two elemental targets of aluminum and manganese each.

Sputtering was accomplished for one hour to eliminate compositional differences in the films related to different elemental sputtering rates. Sputter coating was accomplished with a 5 centimeter diameter r.f. planar magnetron employing 200 watts and a target-to-substrate distance of −10 centimeters. The rate of deposition was typically 0.2 to 0.3 nanometers per second and the substrates were fixed directly to an aluminum block heater. Substrates included glass (soda lime silicate glass) microscope slides, fused quartz ($SiO_2$) plates, alumina ($Al_2O_3$) circuit boards, cleaved sodium chloride (NaCl), and OFHC copper sheet. Films prepared for testing by transmission electron microscopy were approximately 30–50 nanometers thick and those for testing by X-ray diffraction were 1,000–2,000 nanometers thick.

The X-ray diffraction analysis was performed with a conventional X-ray diffractometer by means of CuK-alpha radiation. The analytic electron microscope (AEM) was equipped with an energy dispersive X-ray spectrometer (EDXS) and operated at an accelerating voltage of about 120 kilovolts. Compositional analysis in the AEM was verified by inductively coupled plasma spectroscopy and EDXS on a scanning electron microscope.

In the sputtering method, glow discharge is conducted in a vacuumed inert gas atmosphere. The gas ions are driven to collide with a cathode (target) to evaporate the cathode material in a form of atoms or groups of atoms and the sputtered metal atoms are deposited on a substrate, disposed close to the anode, to form a thin metal layer on the substrate. The magnetron-type sputtering device employs a magnet disposed behind the cathode (target) so that a magnetic field is oriented to be perpendicular to the electric field in the discharge space.

EXAMPLE 1

Thin sputter films were produced on glass substrates by using a radio frequency planar magnetron, discussed above, as a sputtering source with a pre-alloyed target for each run. The target had a composition of 30 weight % manganese with the remainder being aluminum. FIG. 1 shows X-ray diffraction intensity of the sputtered aluminum-manganese on glass at substrate temperatures ranging from about 330° K. (60° C.) to about 690° K. (420° C.). Substrate temperatures are measured to an accuracy of about ±10° C. FIG. 1 shows the X-ray diffraction pattern of materials produced at selected substrate temperatures from the examined range. Quasi-crystalline icosahedral deposits were produced in alloys at substrate temperatures from 350° to 400° C.

It is known that the aluminum-manganese binary system has numerous inter-metallic crystalline phases which can be identified by their X-ray pattern. These include $MnAl_6$, (orthorhombic); $MnAl_4$, $\mu$-Al-Mn, $\phi$-Al-Mn (all hexagonal); the high temperature $MnAl_3$ (orthorhombic); the low temperature $MnAl_3$ (tricinic); and MnAl (tetragonal). In contrast, X-ray patterns of the sputtered 70 weight % aluminum, 30 weight % manganese produced at substrate temperatures of 370° C. confirm the presence of the quasi-crystalline icosahedral ($m\overline{3}\overline{5}$) phase and included no evidence of any other phases. An X-ray pattern for diffracted CuK-alpha radiation between the angles $2\theta$ equals 36°–46° shows the quasi-crystalline formation. The diffracted peaks at 41.7° and 43.9° are evidence of the icosahedral ($m\overline{3}\overline{5}$) quasicrystalline structure. FIG. 1 also shows the criticality of substrate temperature. The quasi-crystalline structure is produced at about 640° K. (370° C.) but the substrate at 330° K. (60° C.) produced amorphous material.

EXAMPLE 2

Figure 2:
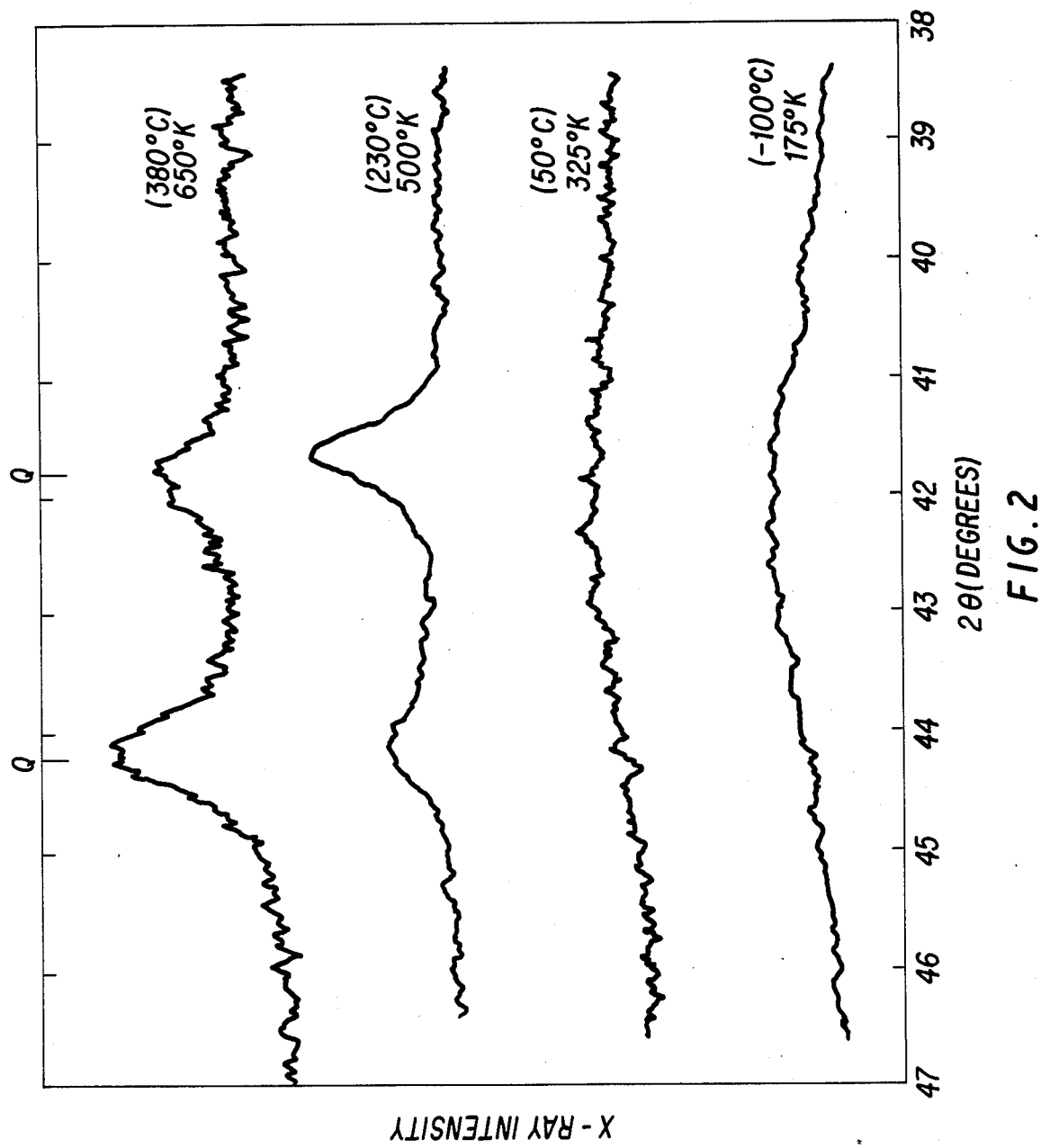
FIG. 2 shows X-ray diffraction patterns for films of aluminum-manganese alloys (30% manganese by weight) sputtered onto glass over a variety of denoted substrate temperatures, icosahedral peaks are indicated by "Q's"

Thin sputtered films produced on glass substrates at temperatures ranging from about 175° K. (−100° C.) to about 650° K. (380° C.) yielded X-ray diffraction patterns as shown on FIG. 2. FIG. 2 shows X-ray intensity as a function of diffraction angle $2\theta$ (CuK-alpha) of the aluminum, 17.4 atomic percent manganese (30 weight percent) films. Substrate temperatures during deposition are denoted. Icosahedral peaks are indicated by Q's. The X-ray pattern comparison is illustrated for the range 38° to 47° ($2\theta$) because many of the key lines for the various possible phases, alpha-aluminum (38.5° and 44.8°), icosahedral (41.7° and 44.1°), $Al_4Mn$ (44.9°, 44.5° and 42.6°), $Al_6Mn$ (33.9°, 42.3° and 43.8°), $Al_{11}Mn_4$, and $Al_{10}Mn_3$ (43.2° and 44.2°) and decagonal (43.5°, 44.5°, 44.2° and 40.2°) lie in this range. Clearly, both the (100000) and (110000) icosahedral ($m\overline{3}\overline{5}$) diffraction lines are apparent for the higher temperature films, 500° K. and 650° K., while no evidence is present for either of the face centered cubic alpha-aluminum (111) and (200) lines, that would be found at 38.5° and 44.8° ($2\theta$) respectively, or any of the other crystalline or decagonal lines. Therefore, it can be concluded that none of the equilibrium phases which yield clear pattern are present in significant amounts other than the icosahedral-phase. The patterns shown for 325° K. and 175° K. indicate an amorphous structure; however, recent X-ray examination of these films using a rotating anode and focusing monochromatic crystal show considerably more detail than is present in FIG. 1 and suggests either a micro-quasi-crystalline structure or a rather complex glassy phase.

A comparison of the X-ray diffraction traces from the films sputter onto the substrates held at 500° K. and 650° K. reveals an indication of texture (preferred orientation) differences, i.e., whereas the [100000] is stronger at 500° K., the [110000] is stronger at 650° K. This result was also observed for numerous other films produced on glass, fused quartz and alumina.

EXAMPLE 3

Figure 3:
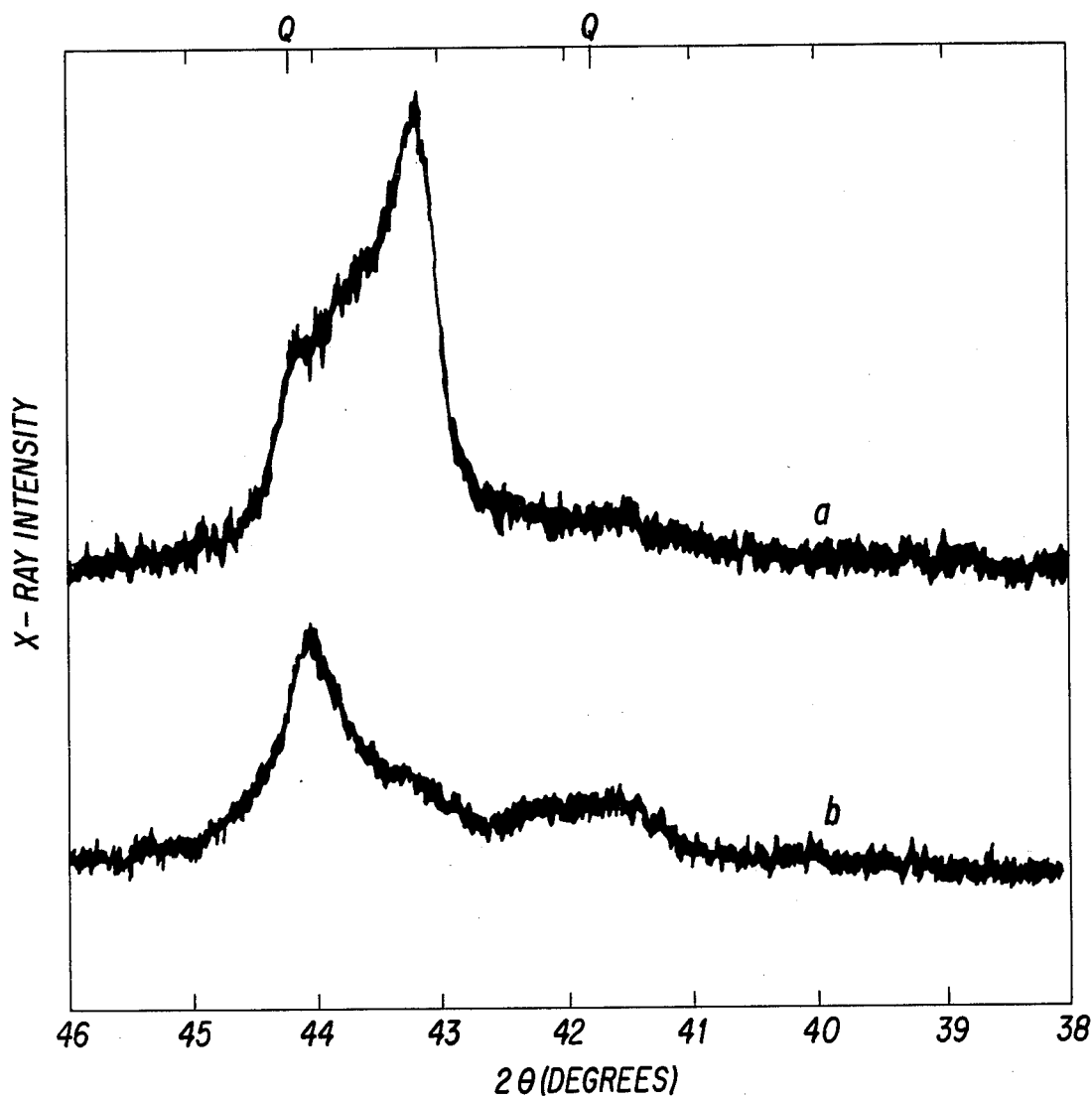
FIG. 3 shows a comparison, at a 670° K. substrate temperature, of sputtering aluminum-manganese alloy onto copper (trace a) versus sputtering onto quartz (trace b)

A comparison of the effect of the substrate material on the texture and phase distribution is illustrated in FIG. 3. FIG. 3 shows X-ray intensity as a function of diffraction angle $2\theta$ for aluminum, 17.4 atomic percent manganese (30 weight percent) films. Trace "a" was sputtered on copper and trace "b" was sputtered on fused quartz. Icosahedral peaks are indicated by Q's. These films were sputtered simultaneously on copper and quartz substrates at about 670° K. (400° C.). Not only are the ratios of the icosahedral [100000] and [110000] lines affected but the appearance of an extra line at approximately 43.4° $2\theta$ is evident in the patterns. In order to determine the source of this extra line, a larger $2\theta$ scan was obtained and the results were consistent with the presence of hexagonal $Al_{10}Mn_3$ phase. Although the decagonal phase has similar lines, the observed pattern lacked the 40.2° decagonal line.

EXAMPLE 4

The X-ray diffraction patterns from the 34 weight % manganese, 4 weight % silicon, aluminum alloy deposited on quartz are presented in FIG. 4. FIG. 4 shows X-ray intensity as a function of diffraction angle 2° of aluminum, 20.2 atomic percent manganese, 4.7 atomic percent silicon, deposited at substrate temperatures of about 630° K. (360° C.) and about 320° K. (50° C.). Icosahedral peaks "Q" are clearly evident in the 630° K. (360° C.) film. As in the aluminum-manganese (FIG. 2) system, the icosahedral phase pattern is evident in the film produced at a substrate temperature of 630° K. In contrast, the 320° K. substrate resulted in amophous material. In addition to those lines between 39° and 46° there were small lines at 23°, 62°, and 74.4°, which are consistent with the icosahedral phase, and a weak line at 48.5°. The major difference between these patterns and those from the binary aluminum-manganese films was a slight (0.2-0.3°) shift to lower $2\theta$ values for the ternary films. Also some diffraction was observed at 43.3° (strong) and 44.8° (weak), indicating the probable presence of both $Al_{10}Mn_3$, or the isomorphous beta-$Al_9Mn_3Si$ phase, and alpha-Al, respectively.

EXAMPLE 5

Figure 5A:
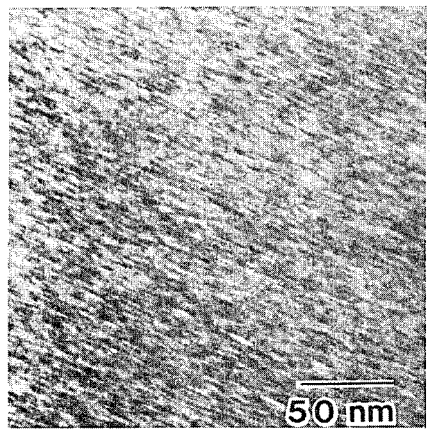
FIGS. 5a–5c show photographs by analytical electron microscopy for aluminum-manganese alloy deposited on sodium chloride at 195° K., 300° K. and 500° K., respectively.
Figure 5D:
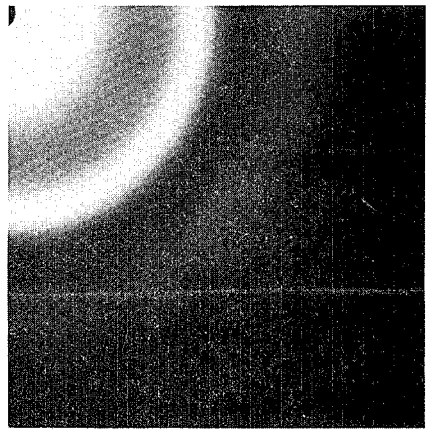
FIGS. 5d–5f show selected area diffraction patterns for the samples of FIG. 5a–5c, respectively.
Figure 5B:
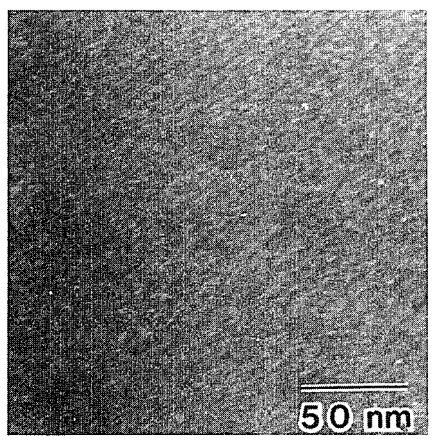
Figure 5E:
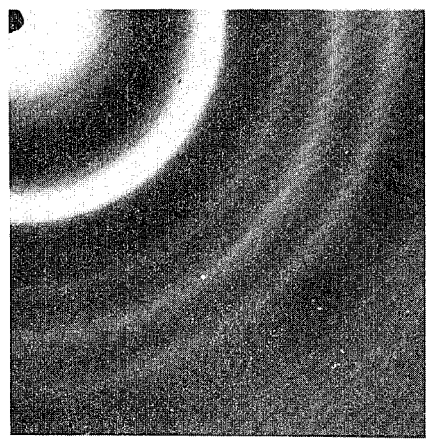
Figure 5C:
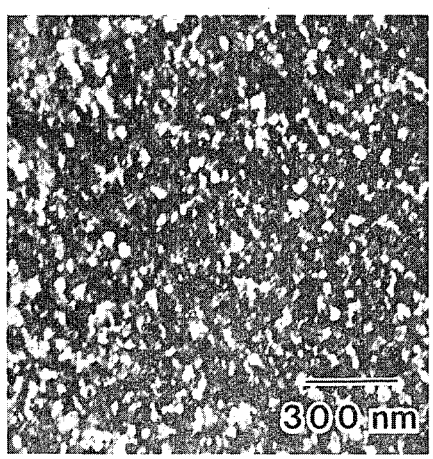
Figure 5F:
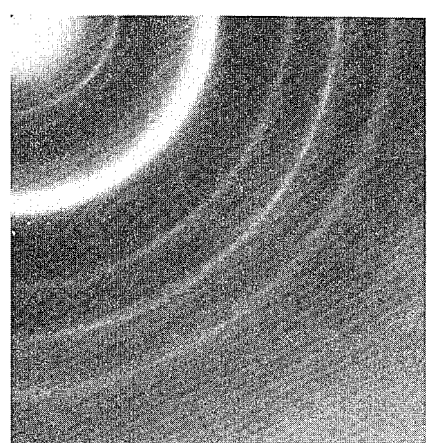

Thin (30-50 nanometer thick) film samples were deposited on sodium chloride at a range of temperatures and were examined by analytical electron microscopy (AEM), for comparison to the X-ray diffraction analysis for the binary Al-Mn system. FIGS. 5a-5c are darkfield electron micrographs (obtained using the most intense rings in selected area diffraction patterns, SAPDs). FIGS. 5d-5f, respectively, are corresponding SAPDs from aluminum-manganese films at three deposition temperatures: (a) 195° K., (b) 300° K., and (c) 500° K. The circular rings in FIGS. 5d-5f are characteristic of the icosahedral (m $\bar{3}$ $\bar{5}$) phase. FIG. 5c employs a larger (300 nm) scale than FIGS. 5a and 5b because the grain size is larger in FIG. 5c. The microstructures and selected area diffraction patterns (SADPs) were consistent with the X-ray results, i.e., the structures containing small clusters of the icosahedral phase with no evidence for any of the other crystalline or quasi-crystalline phases. Furthermore, the SAPD from the room temperature (300° K.) Al-Mn deposit displays rings which, though at first appearance suggests an "amorphous" structure, have spacings and intensities consistent with a very fine distribution of the icosahedral phase.

EXAMPLE 6

Figure 6A:
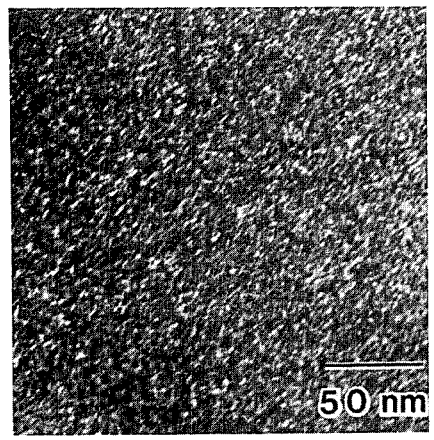
FIGS. 6a–6c show photographs by analytical electron microscopy of an aluminum-manganese silicon alloy deposited on sodium chloride at 195° K., 325° K., and 650° K., respectively.
Figure 6D:
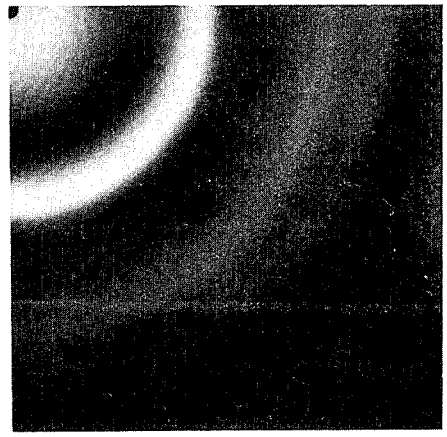
FIGS. 6d–6f show selected area diffraction patterns for the samples of FIGS. 6a–6c, respectively.
Figure 6B:
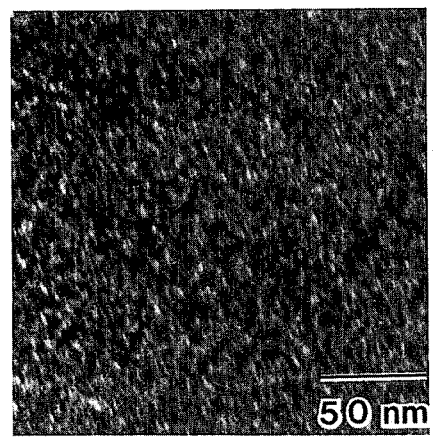
Figure 6E:
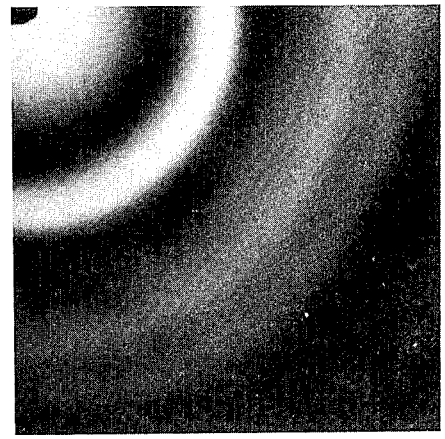
Figure 6C:
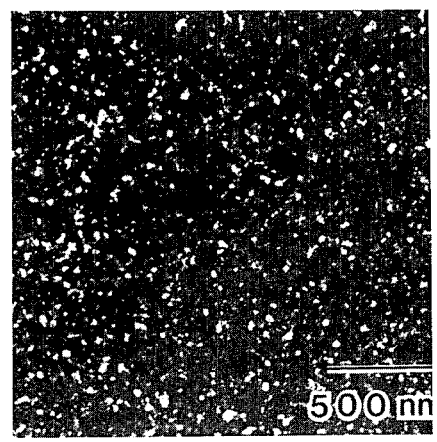
Figure 6F:
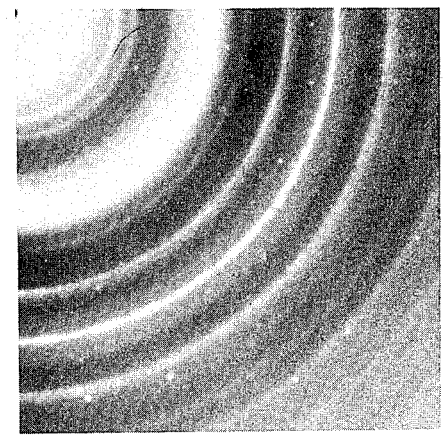

Thin (30-50 nanometer thick) films of 34 weight % manganese, 4 weight % silicon, aluminum were deposited on sodium chloride at a range of temperatures and examined by analytical electron microscopy (AEM) for comparison to the X-ray diffraction analysis. FIGS. 6a-6c show dark-field electron micrographs (obtained using most intense ring in SAPDs). FIGS. 6d-6f, respectively, show SAPDs from aluminum, manganese, silicon films ant three deposition temperatures: (a) 190° K., (b) 325° K., and (c) 650° K. The circular rings in FIGS. 6d-6f are characteristic of the icosahedral (m $\bar{3}$ $\bar{5}$) phase. FIG. 6c employs a larger (500 nm) scale than FIGS. 6a and 6b because the grain size is larger in FIG. 6c. The microstructures and selected area diffraction patterns (SADPs) were consistent with the X-ray results, i.e., the structures contain small cluster of the icosahedral phase with no evidence for any of the other crystalline or quasi-crystalline phases. Furthermore, the SAPDs from the 190° K. deposit displayed rings which, though at first appearance suggest an "amorphous" structure, have spacings and intensities consistent with a very fine distribution of the icosahedral phase.

EXAMPLE 7

Figure 7B:
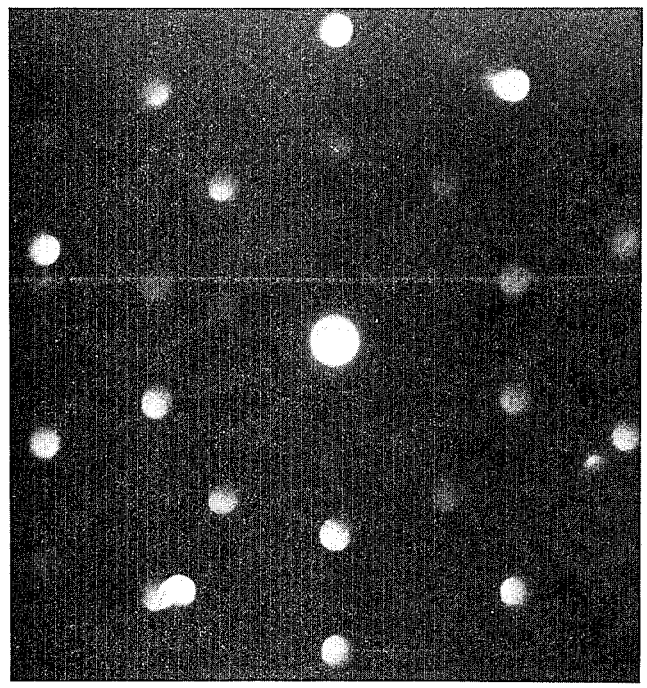
Figure 7A:
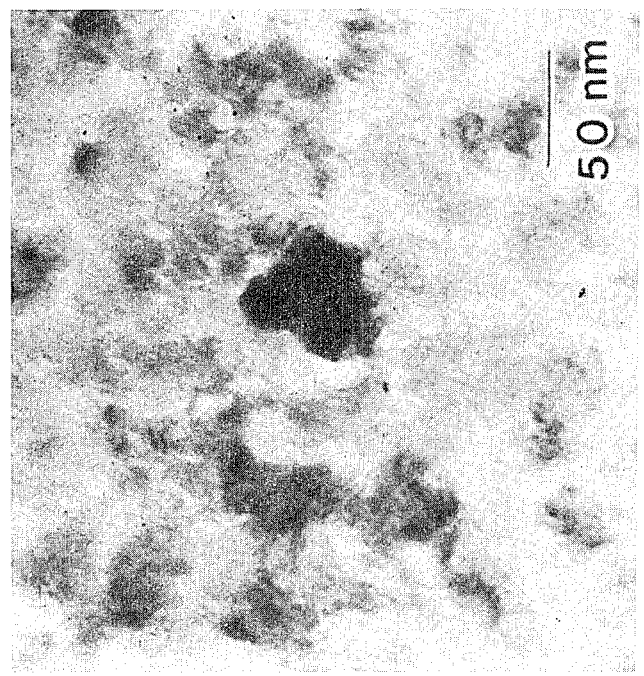
FIG. 7a displays a bright field image of an aluminum-manganese-silicon film deposited at 650° K. onto sodium chloride.

To confirm that the phase of interest in the films shown by FIG. 6c has the icosahedral (m $\bar{3}$ $\bar{5}$) structure rather than some other phase or mixture of phases, the Al-Mn-Si film deposited at 650° K. was analyzed more closely by microdiffraction. FIG. 7a displays a bright field electron micrograph image of this film where one of the larger particles of the phase of interest was oriented to diffract strongly. FIG. 7b shows the corresponding microdiffraction pattern from this particle, which is a strongly diffracting (dark) region in FIG. 7a. This microdiffraction pattern displays the ten-fold symmetry characteristic of the m 3 5 (i-phase) phase and confirms its identification.

In conclusion, the icosahedral phase can be formed directly by sputter depositing from pre-alloyed targets having compositions known to form this phase during rapid quench experiments. The experimental observations are consistent with the ideas proposed by Bendersky and Ridder, discussed above, on the formation of a "micro-quasi-crystalline" structure at large undercoolings at predicted existence of icosahedral clusters in the disordered liquid state.

While specific embodiments of the process aspects of the present invention have been shown and described, it should be apparent that many modifications can be made thereto without departing from the spirit and scope of the invention. Accordingly, the invention is not limited by the foregoing description, but is only limited by the scope of the claims appended thereto.

I claim:

1. A method for producing icosahedral material comprising the steps of:

vacuum sputtering, onto a substrate, a depositing species of an alloy, which can be used to produce an icosahedral structure by melt spinning, at sputtering conditions to form said icosahedral material as a film onto said substrate, said sputtering occurring in an atmosphere consisting essentially of a noble gas.

2. The method of claim 1, wherein said alloy comprises aluminum.

3. The method of claim 2, wherein said sputtering occurs at a rate of deposition of said alloy on said substrate from about 0.1 to about 1.0 nm/s.

4. The method of claim 3, wherein said substrate is selected from the group consisting of metal oxides, silicon oxide and ionic crystals.

5. The method of claim 4, wherein said alloy further comprises a transition metal.

6. The method of claim 5, wherein said sputtering conditions comprise a substrate temperature from about 200° to about 450° C.

7. The method of claim 6, wherein said noble gas consists essentially of argon.

8. The method of claim 7, wherein said sputtering conditions comprise a rate of deposition of said alloy on said substrate from about 0.2 to about 0.3 nm/s.

9. The method of claim 8, wherein said alloy is selected from the group consisting of 30±1 weight percent manganese with a remainder being aluminum; and 34±1 weight percent manganese, 4±½ weight percent silicon with a remainder being aluminum.

10. The method of claim 9, wherein said sputtering conditions comprise a substrate temperature from about 350° to about 400° C.

11. The method of claim 10, wherein said sputtering occurs at a pressure of at most about 3.0 Pascals.

12. The method of claim 11, wherein said substrate is selected from the group consisting of NaCl, soda lime silicate glass, fused quartz, and $Al_2O_3$.

13. The method of claim 12, wherein said sputtering occurs at a pressure of at most about 0.3 Pascals.

14. A method for producing icosahedral material from an alloy which can be used to produce an icosahedral structure by melt spinning, the improvement comprising vacuum sputtering said alloy onto a substrate in an atmosphere consisting essentially of a noble gas at sputtering conditions to produce said icosahedral material as a film on said substrate.

* * * * *